United States Patent
Borodovsky

(10) Patent No.: US 7,142,282 B2
(45) Date of Patent: Nov. 28, 2006

(54) DEVICE INCLUDING CONTACTS

(75) Inventor: Yan Borodovsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/688,306

(22) Filed: Oct. 17, 2003

(65) Prior Publication Data

US 2005/0083497 A1 Apr. 21, 2005

(51) Int. Cl.
G03B 27/42 (2006.01)
G03B 27/54 (2006.01)
G03F 1/00 (2006.01)

(52) U.S. Cl. ............................ 355/53; 355/67; 430/5

(58) Field of Classification Search ............... 355/67, 355/53; 250/550; 430/5, 316, 311; 365/129
See application file for complete search history.

(56) References Cited

U.S. PATENT DOCUMENTS

| | | | |
|---|---|---|---|
| 4,517,280 A | 5/1985 | Okamoto et al. | |
| 5,041,361 A | 8/1991 | Tsuo | |
| 5,328,807 A | 7/1994 | Tanaka et al. | |
| 5,415,835 A | 5/1995 | Brueck et al. | |
| 5,705,321 A | 1/1998 | Brueck et al. | |
| 5,759,744 A | 6/1998 | Brueck et al. | |
| 6,042,998 A * | 3/2000 | Brueck et al. | 430/316 |
| 6,233,044 B1 | 5/2001 | Brueck et al. | |
| 6,548,820 B1 * | 4/2003 | Mermelstein | 250/550 |
| 6,553,562 B1 | 4/2003 | Capodieci et al. | |
| 6,818,389 B1 * | 11/2004 | Fritze et al. | |
| 6,884,551 B1 * | 4/2005 | Fritze et al. | |
| 6,946,666 B1 | 9/2005 | Saito et al. | |
| 2002/0078427 A1 | 6/2002 | Palmer et al. | |
| 2003/0091940 A1 | 5/2003 | Nasao | |
| 2004/0110092 A1 | 6/2004 | Lin | |
| 2005/0028129 A1 | 2/2005 | Hsu et al. | |
| 2005/0073671 A1 | 4/2005 | Borodovsky | |
| 2005/0074698 A1 | 4/2005 | Borodovsky | |
| 2005/0085085 A1 | 4/2005 | Borodovsky | |
| 2005/0088633 A1 | 4/2005 | Borodovsky | |
| 2006/0017910 A1 | 1/2006 | Borodovsky | |

FOREIGN PATENT DOCUMENTS

| | | |
|---|---|---|
| EP | 0855623 | 7/1998 |
| EP | 0 915 384 | 5/1999 |
| EP | 0 964 305 | 12/1999 |
| JP | 2002-33265 | 1/2002 |
| WO | WO97/48021 | 12/1997 |
| WO | WO 98/32054 | 7/1998 |
| WO | WO03/071587 | 8/2003 |
| WO | WO05/036273 | 4/2005 |
| WO | WO 05/036274 | 4/2005 |
| WO | WO 05/043249 | 5/2005 |
| WO | WO 05/083513 | 9/2005 |

OTHER PUBLICATIONS

M. Fritze, et al., "Gratings of regular arrays and trim exposures for ultralarge scale integrated circuit phase-shift lithography", *J. of Vacuum Science & Technology B*, 19(6):2366-2370, Nov./Dec. 2001.

(Continued)

*Primary Examiner*—Rodney Fuller
(74) *Attorney, Agent, or Firm*—Fish & Richardson P.C.

(57) ABSTRACT

A device that includes contacts. In one implementation, a device includes a substantially arbitrary arrangement of contacts. The contacts in the device are defined with a definition characteristic of interference lithography.

25 Claims, 8 Drawing Sheets

OTHER PUBLICATIONS

J.A. Hoffnagle, et al., "Liquid immersion deep-ultraviolet interferometric lithography", *J. of Vacuum Science & Technology B*, 17(6):3306-3309, Nov./Dec. 1999.

Marc D. Levenson, et al., "Exposing the DUV SCAAM—75 nm Imaging on the Cheap!", *Proc. of SPIE: Design, Process Integration, and Characterization for Microelectronics*, 4692:288-297, Mar. 2002.

Alex K. Raub, et al., "Deep UV immersion interferometric lithography", *Proc. of SPIE: Optical Microlithography XVI*, 5040:667-678, Feb. 2003.

Bruce W. Smith, et al., "Water immersion optical lithography at 193 nm", *J. Microlith., Microfab., Microsyst.*, 3(1):44-51, Jan. 2004.

Akiyoshi Susuki, et al., "Multilevel imaging system realizing $k_1+=0.3$ lithography", *Proc. of SPIE: Optical Microlithography XII*, 3679:396-407, Mar. 1999.

M. Switkes, et al., "Extending optics to 50 nm and beyond with immersion lithography", *J. of Vacuum Science & Technology B*, 21(6):2794-2799, Nov./Dec. 2003.

Brian Tyrrell, et al., "Investigation of the physical and practical limits of dense-only phase shift lithography for circuit feature definition", *J. Microlith., Microfab., Microsyst.*, 1(3):244-252, Oct. 2002.

Saleem H. Zaidi, et al., "Multiple exposure interferometric lithography", *Proc. of SPIE: Optical Microlithography VII*, 2197:869-875, Mar. 1994.

M. Fritze, et al., Preprint of poster presentation entitled "High-Throughput Hybrid Optical Maskless Lithography: All-Optical 32-nm Node Imaging,", Presented at SPIE Microlithography 2005, San Jose, California, USA, Mar. 3, 2005.

Ishibashi, et al., "AFM Lithography Combined with Optical Lithography", *IEEE Microprocesses and Nanotechnology conference 2000*, pp. 192-193 (Jul. 2000).

Martin, et al., "Ordered Magnetic Nanostructures: Fabrication and Properties", *J. Magnetism and Magnetic Materials*, 256(1-3):449-501 (Jan. 2003).

\* cited by examiner

DEVICE INCLUDING CONTACTS

BACKGROUND

This disclosure relates to the printing of substrates.

Various lithographic techniques can be used to print patterns such as those that define integrated circuits in microelectronic devices. For example, optical lithography, e-beam lithography, UV and EUV lithography, x-ray lithography and imprint printing techniques can all be used to form micron- and submicron-sized features.

DESCRIPTION OF DRAWINGS

Like reference symbols in the various drawings indicate like elements.

DETAILED DESCRIPTION

Figure 1:
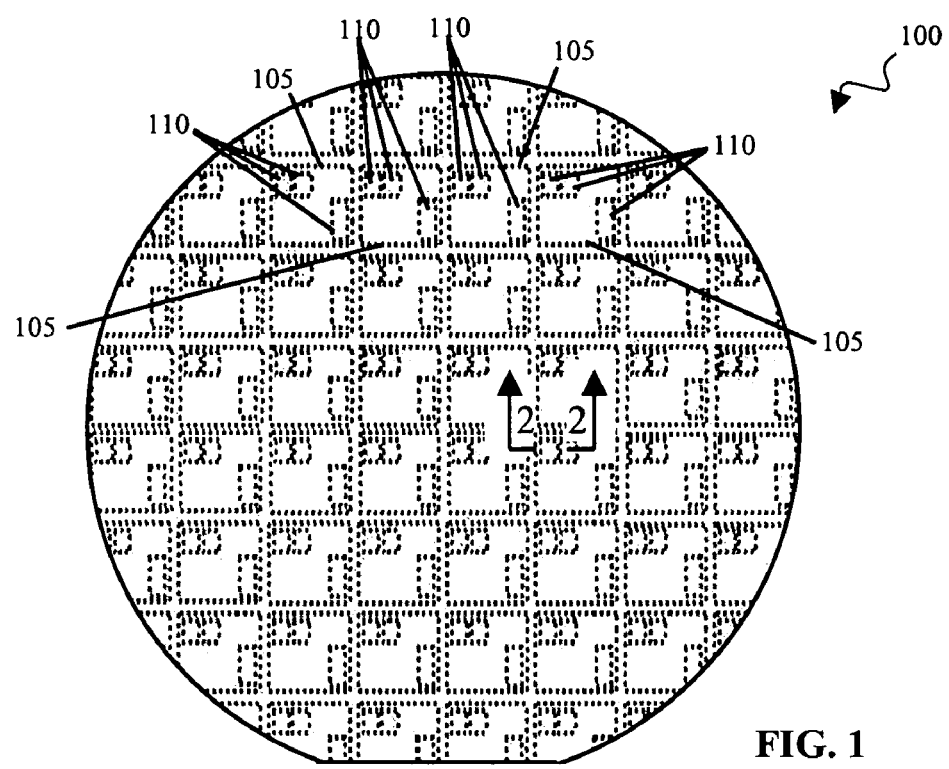
FIG. 1 is a top view of a wafer.

FIG. 1 shows a top view of a wafer 100. Wafer 100 is a semiconductor wafer being processed to form at least one integrated circuit device such as a microprocessor, a chipset device, or a memory device. For example, wafer 100 can be used to form a collection of SRAM memory devices. Wafer 100 can include silicon, gallium arsenide, or indium phosphide. Wafer 100 includes an array of die portions 105. Wafer 100 can be diced or otherwise processed to form a collection of dice that can be packaged to form individual integrated circuit devices. Each die portion 105 includes one or more layout pieces 110. A layout piece 110 is a section of a die portion 105 that includes a pattern. The pattern defined in a layout piece 110 generally contributes to the function of integrated circuit devices formed from die portions 105.

Figure 2:
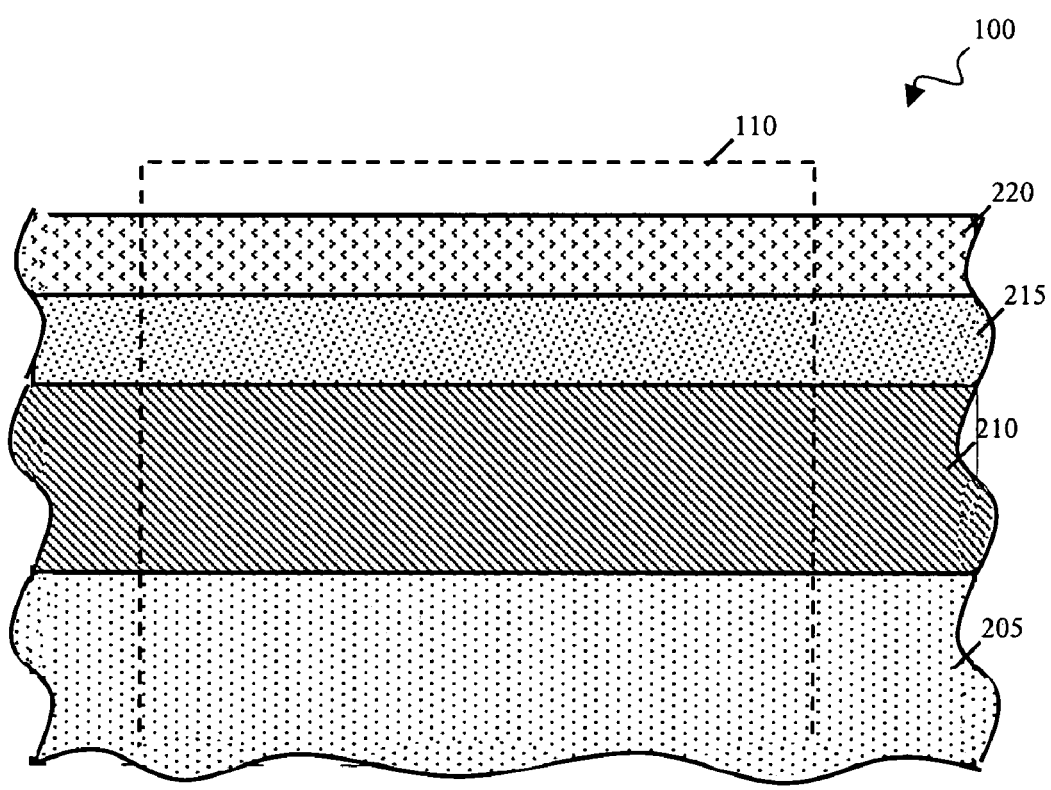
FIG. 2 is a sectional view of a portion of a layout piece on a wafer during processing.

FIG. 2 is a sectional view of a portion of layout piece 110 on wafer 100. At the processing stage illustrated in FIG. 2, layout piece 110 includes a substrate 205, a pattern layer 210, a sacrificial layer 215, and a printing layer 220. Substrate 205 can be the base wafer or another layer formed during previous processing. Pattern layer 210 is the portion of layout piece 110 that is to be patterned. Pattern layer 210 can be patterned to form all or a portion of a microelectronic device. Pattern layer 210 can be, e.g., an electrical insulator such as silicon dioxide or nitride, a semiconducting material such as p- or n-doped silicon, or a conducting layer such as copper or aluminum. Sacrificial layer 215 is a temporary layer that can be selectively removed from pattern layer 210. Sacrificial layer 215 can be an interlayer dielectric (ILD) such as a silicon oxide or nitride. Printing layer 220 is a material that is sensitive to one or more techniques for printing patterns. For example, printing layer 220 can be a positive or negative photoresist. The following description assumes printing layer 220 to be a positive photoresist.

Figure 3:
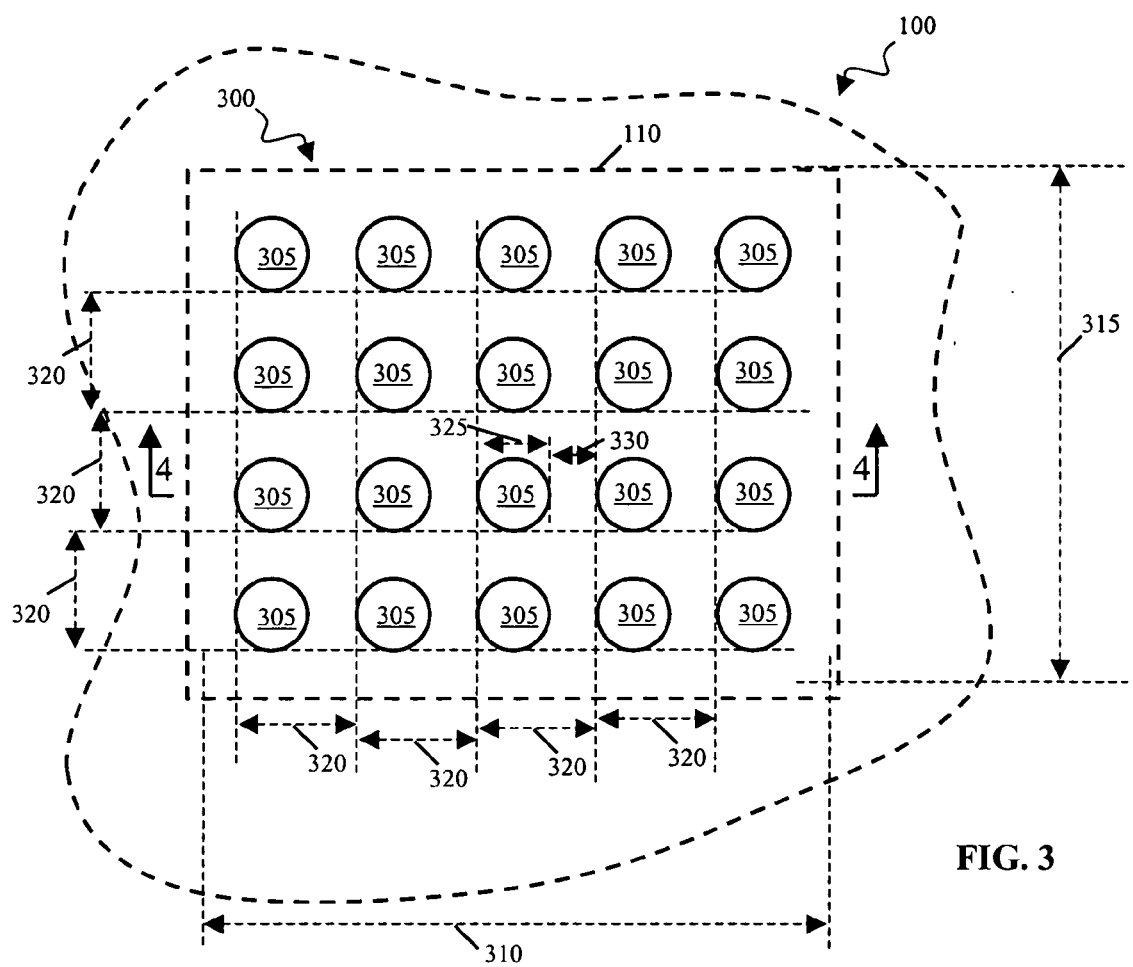
FIG. 3 is a top view of a layout piece after exposure and development to form a two-dimensional array of features.
Figure 4:
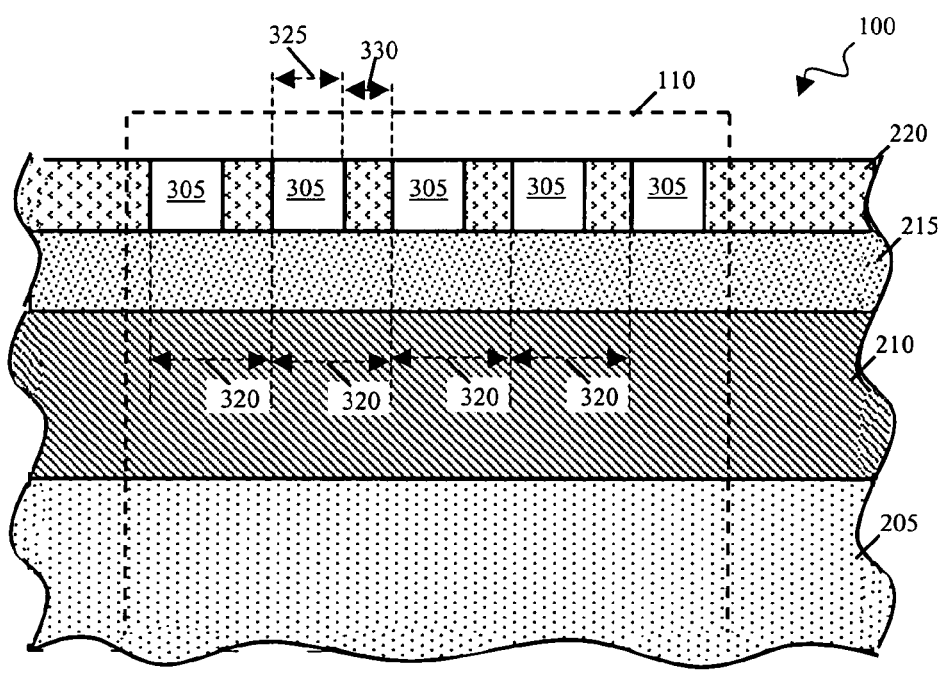
FIG. 4 is a sectional view of the layout piece of FIG. 3.

Resist layer 220 can be exposed and developed to form a pattern. FIG. 3 is a top view and FIG. 4 is a sectional view of layout piece 110 after exposure and development to form a two-dimensional array 300 of repeating features 305. Features 305 repeat in array 300 in that, excepting manufacturing defects and other irregularities in individual features 305, array 300 includes a repetitive order or arrangement of individual features 305. Array 300 can be rectangular or square with a length 310 and a width 315 that occupies all or a portion of layout piece 110. Features 305 in array 300 have a pitch 320. The pitch of features is the smallest spatial periodicity of the features. For example, contact pitch 320 is the sum of the width 325 of a contact 305 and the shortest distance 330 to the next nearest contact 305. Only a single pair of contacts 305 need be at pitch 320. Thus, the separation distance and width of contacts 305 can vary (e.g., in the horizontal and vertical directions) and array 300 can still have pitch 320.

Features 305 can be formed using any of a number of different lithographic techniques such as e-beam lithography, interference lithography, and optical lithography using phase-shifting masks and optical proximity correction techniques. These lithographic techniques can involve the exposure of wafer 100 using an interference pattern. For example, features 305 can be formed using interference lithography by exposing resist 220 using two orthogonal sets of interfering laser beams with a wavelength $\lambda_1$ to form the array of features with pitch 320 approaching $\frac{1}{2}\lambda_1$. The orthogonal sets can be generated by splitting a single source four ways using a pyramidal prism and interfering the reflections from two orthogonal pairs of opposing pairs of mirrors. The orthogonal pairs can illuminate a substrate at different angles of illumination or the orthogonal pairs can illuminate a substrate at the same angle of illumination. Illuminating at the same angle can impart the substrate with the same pitch in both, orthogonal, directions. Alternatively, the orthogonal sets can be generated by double exposing resist 220 after wafer 100 is subject to a 90° rotation in a traditional interferometric lithography system.

Features 305 can display features characteristic of the lithographic technique used to form features 305. For example, when features 305 are formed using interference lithography, features 305 can be formed with a definition characteristic of interference lithography and a pitch approaching $\frac{1}{2}\lambda_1$ with minimal feature distortion of the type that arises due to imperfections in projection printing systems and techniques. For example, features 305 can be formed without imperfections that arise due to the use of a mask, lenses, projection optics, and/or the backscattering of electrons. Features 305 can also show the influence of the relatively large depth of focus provided by interferometric lithography techniques. For example, the relatively large depth of focus can provide precise control of the dimensional characteristics of features, especially relative to the control provided by optical systems in which high numerical apertures limit both the depth of field and the ability to print real world substrates that are not ideally flat.

Figure 5:
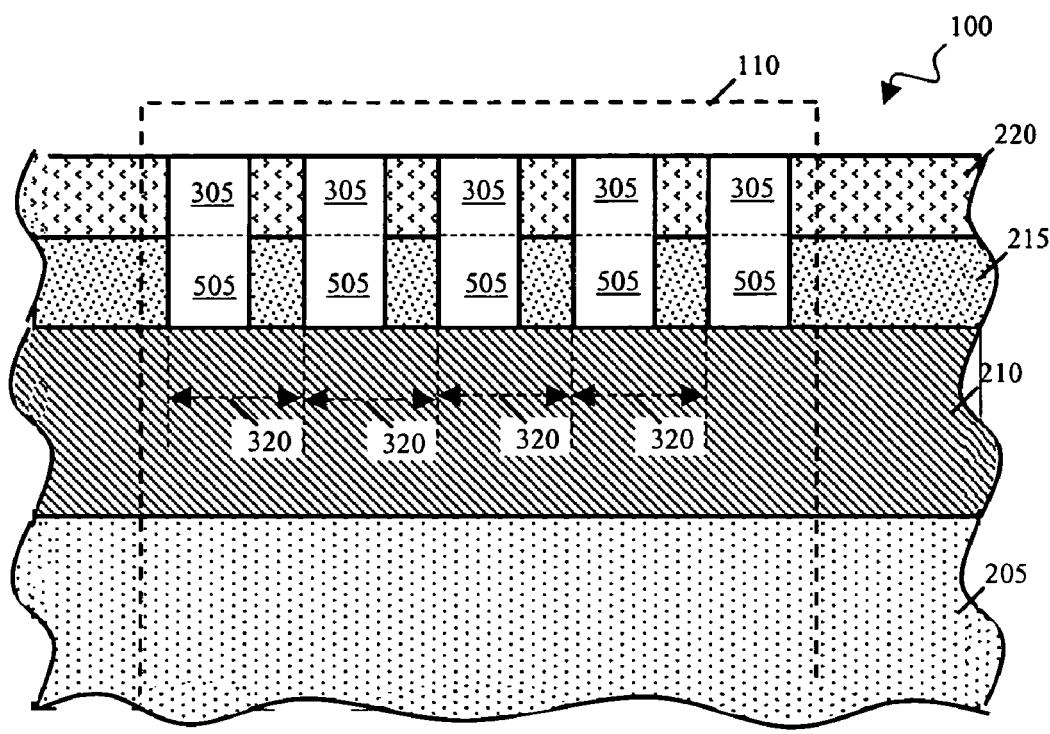
FIGS. 5, 6, and 7 are sectional views along the same plane as FIG. 4 after additional processing.
Figure 6:
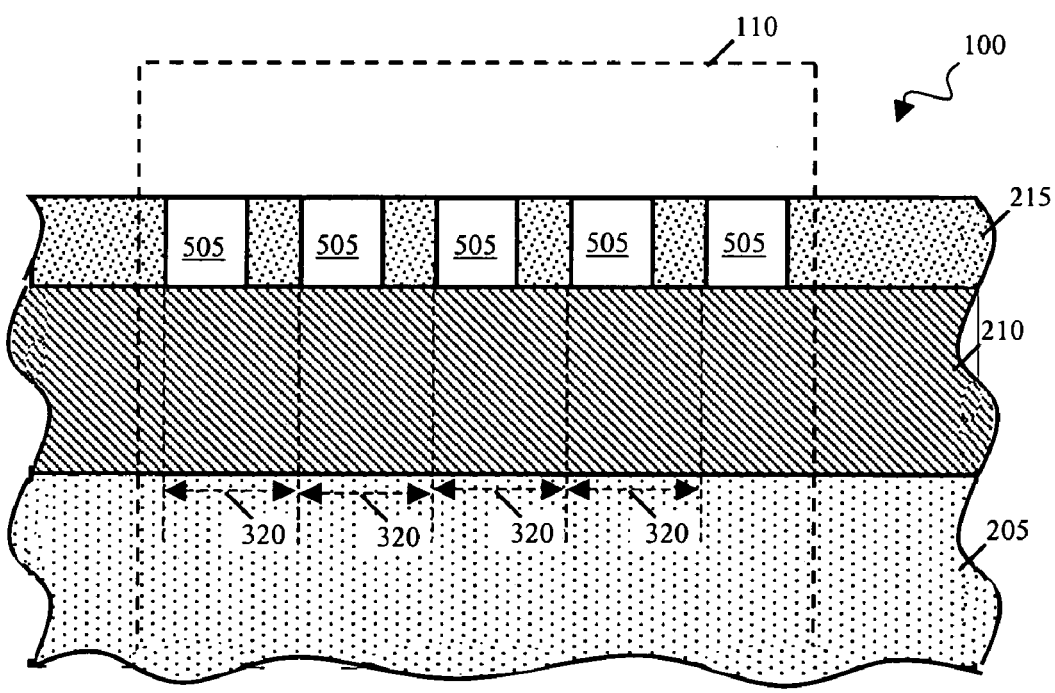
Figure 7:
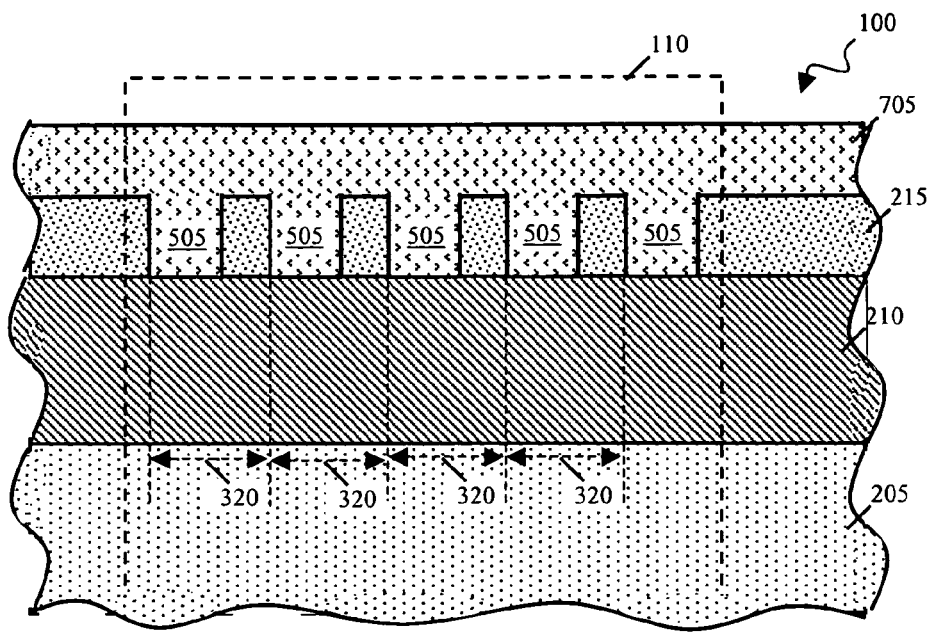

FIGS. 5, 6, and 7 are sectional views along the same plane as FIG. 4 after additional processing. In particular, FIG. 5 shows layout piece 110 after an etch has defined cavities 505 in sacrificial layer 215. For example, cavities 505 can be defined using a dry plasma etch. Cavities 505 can inherit the character of features 305 that are characteristic of the lithographic technique used to form features 305. For example, when features 305 are exposed using interference lithography, cavities 505 can inherit the definition characteristic of interference lithography where minimal pitch approaches ½$\lambda_1$ with minimal feature distortion of the type that arises due to imperfections in projection printing systems and techniques. Cavities 505 can be generally cylindrical with their axes oriented perpendicular to the plane of wafer 100. Cavities 505 can be defined to have substantially the same pitch 320 as features 305. Cavities 505 can have diameters smaller, larger, or substantially the same as the diameters of features 305, depending on the etch process selected to define cavities 505.

FIG. 6 shows layout piece 110 after resist 220 has been stripped. FIG. 7 shows layout piece 110 after a new resist layer 705 has been formed above sacrificial layer 215. Resist layer 705 can either cap or fill cavities 505 of sacrificial layer 215. Resist layer 705 can be formed, e.g., by spin coating photoresist on wafer 100.

Figure 8:
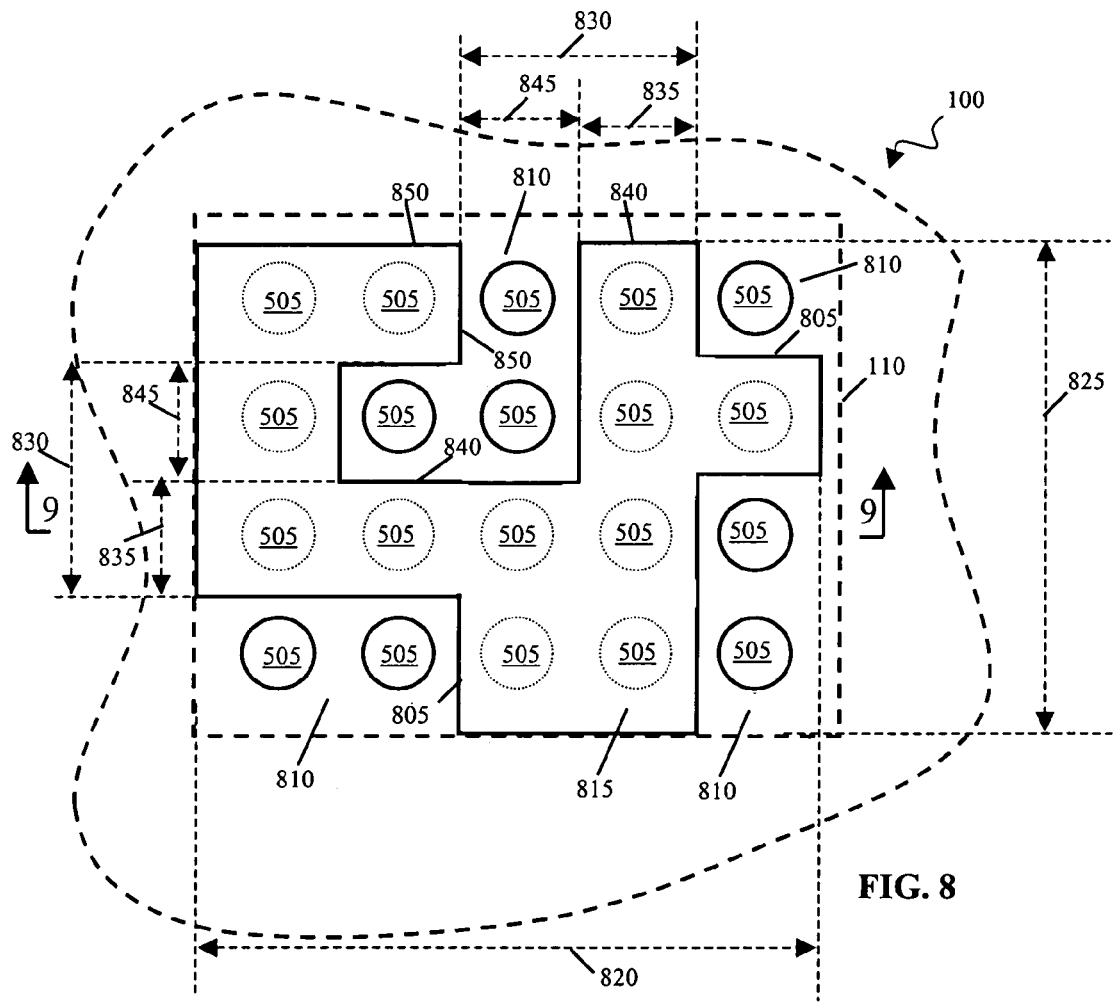
FIG. 8 shows a top view of a layout piece after exposure and development to form a pattern.
Figure 9:
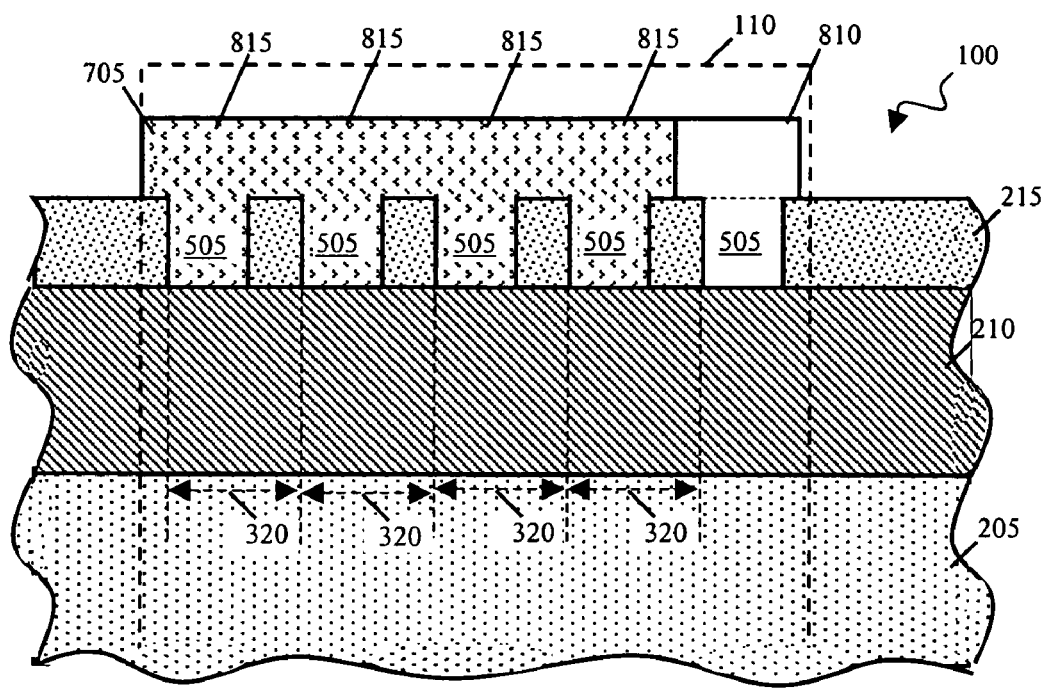
FIG. 9 shows a sectional view of the layout piece of FIG. 8.

FIG. 8 shows a top view and FIG. 9 shows a sectional view of layout piece 110 after resist layer 705 has be exposed and developed to form a Figure 805. Figure 805 can be arbitrarily shaped in that F*igure* 805 need not include a repetitive order or arrangement. Figure 805 is aligned with the two-dimensional array of cavities 505 to either expose (for example, at 810) or cover (for example, at 815) individual cavities 505.

Figure 805 can be formed with a length 820 and a width 825 that occupies all or a portion of layout piece 110. Figure 805 can include elements with a pitch 830. Pattern element pitch 830 is the sum of the width 835 of an element 840 and the shortest distance 845 to the next nearest element 850. Only a single pair of elements in Figure 805 need be at pitch 830. Thus, the separation distance and width of elements can vary, and Figure 805 can still have pitch 830. Pitch 830 can be two or more times as large as contact pitch 320.

Since pattern pitch 830 can be relatively larger than contact pitch 320, Figure 805 can be formed using lithographic systems and techniques that have a lower resolution than the systems and techniques used to form features 305. For example, if features 305 are formed using an interferometric lithography system with a wavelength $\lambda_1$, then Figure 805 can be formed using an optical lithography system with a wavelength larger than $\lambda_1$. As another example, Figure 805 can be formed using a traditional binary optical lithography system, or other lithographic systems such as imprint and e-beam lithographic systems capable of achieving the lower resolution.

The exposure or shielding of cavities 505 by Figure 805 can be used to introduce irregularity into the repeating array of cavities 505 after hardening of resist 705. In other words, the arbitrary shape of Figure 805 can be used to stop the periodic reoccurrence of features in layout piece 110.

Figure 10:
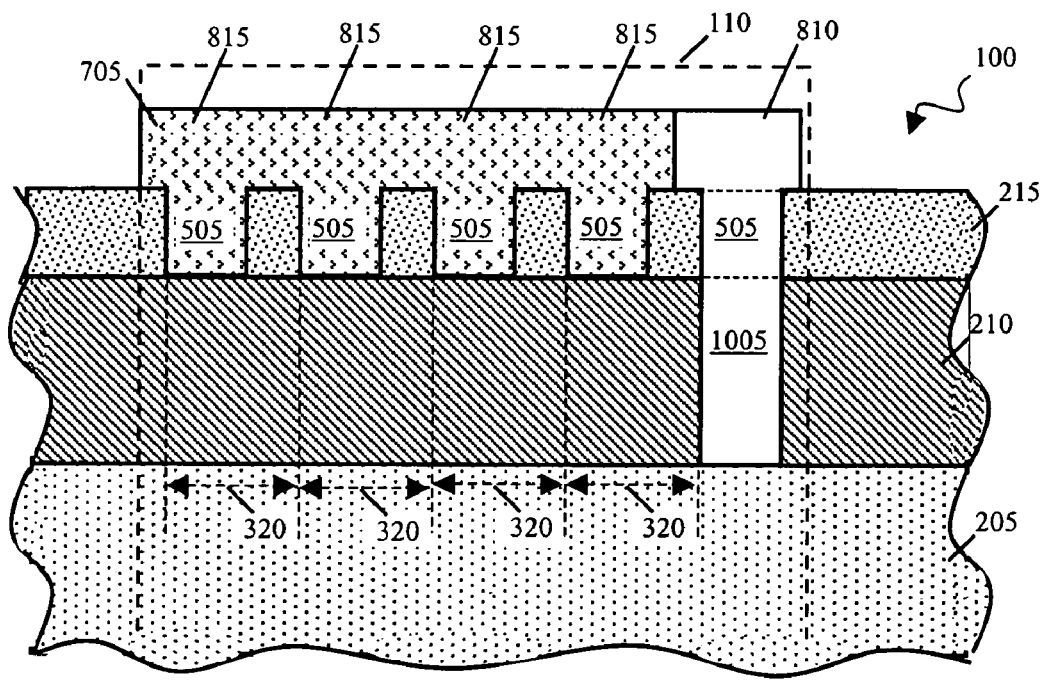
FIGS. 10 and 11 are sectional views along the same plane as FIG. 9 after additional processing.
Figure 11:
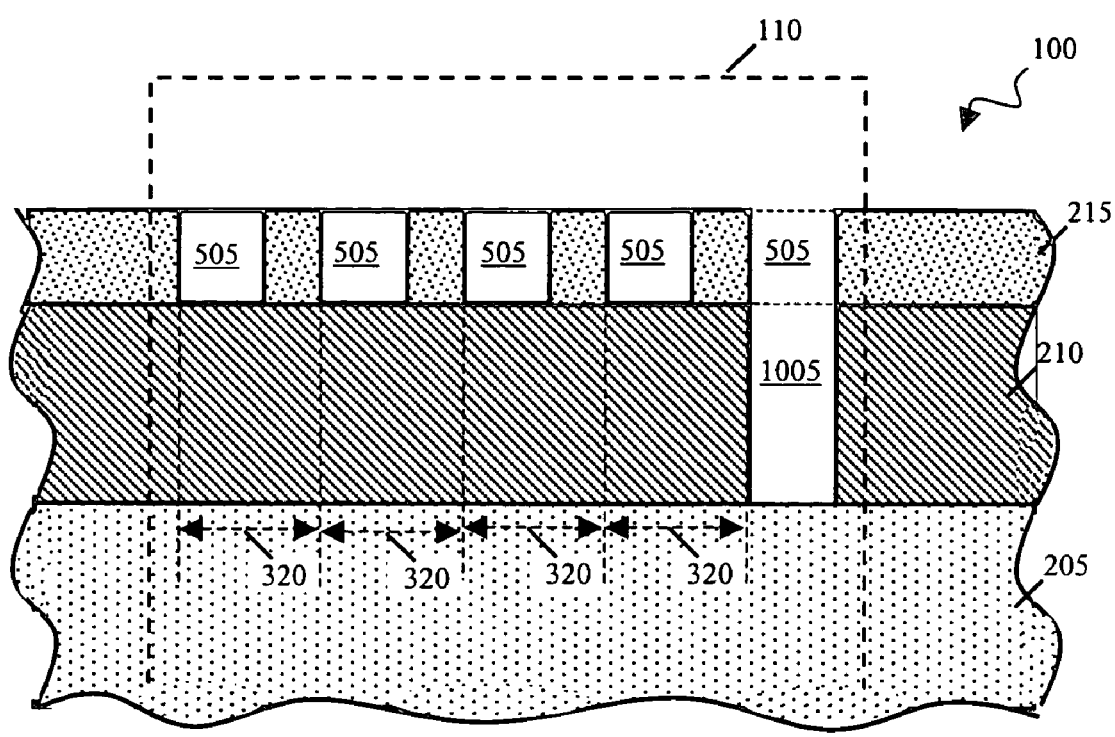

FIGS. 10 and 11 are sectional views along the same plane as FIG. 8 after additional processing. In particular, FIG. 10 shows layout piece 110 after an etch has defined cavities 1005 in pattern layer 210. For example, cavities 1005 can be defined using a dry plasma etch. Cavities 1005 can inherit, by way of cavities 505, the character of features 305 that are characteristic of the lithographic technique used to form features 305. For example, when features 305 are exposed using interference lithography, cavities 1005 can inherit, by way of cavities 505, the definition characteristic of interference lithography with minimal feature distortion of the type that arises due to imperfections in projection printing systems and techniques at a pitch approaching $\lambda_1$. Cavities 1005 can be generally cylindrical, with their axes oriented perpendicular to the plane of wafer 100. Cavities 1005 can be defined to have substantially the same pitch 320 as features 305. Cavities 1005 can have diameters smaller, larger, or substantially the same as the diameters of cavities 505.

Figure 12:
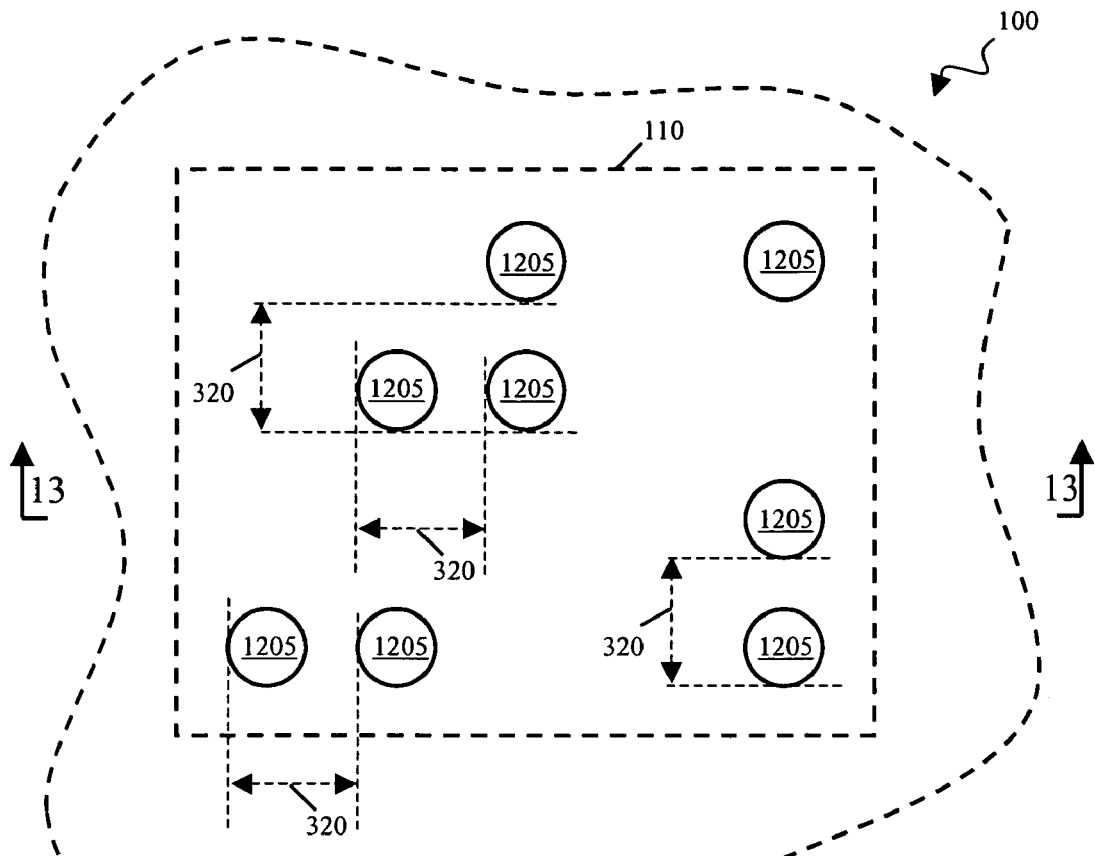
FIG. 12 shows a top view of a layout piece after removal of a sacrificial layer.
Figure 13:
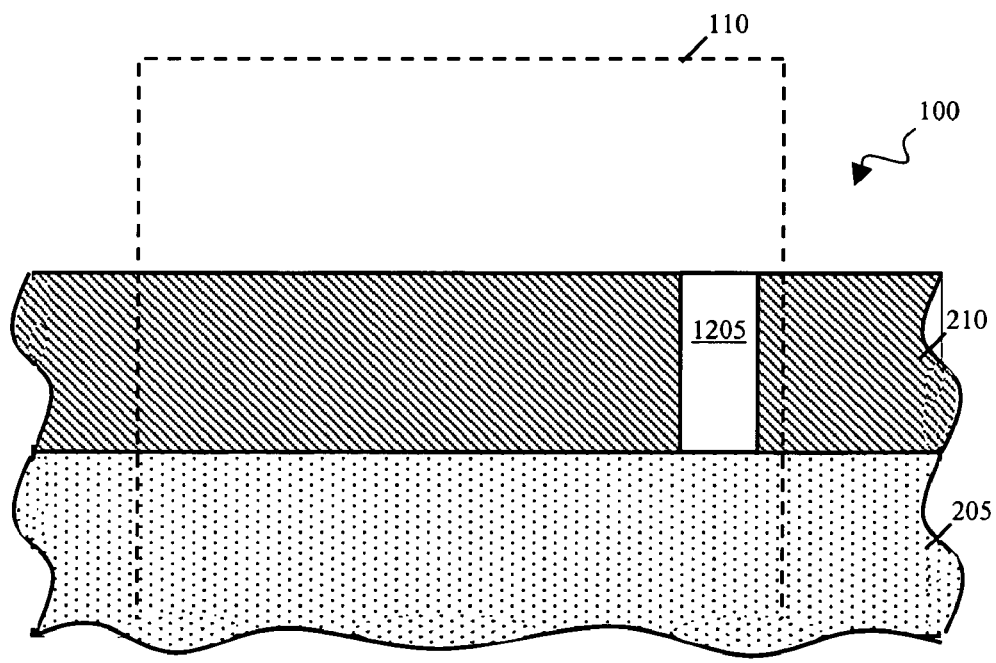
FIG. 13 shows a sectional view of the layout piece of FIG. 12.

FIG. 11 shows layout piece 110 after resist 705 has been stripped to expose previously covered cavities 505. FIG. 12 shows a top view and FIG. 13 shows a sectional view of layout piece 110 after sacrificial layer 215 has been removed. Sacrificial layer 215 can be removed by chemical mechanical polishing (CMP) or by etching. After removal of sacrificial layer 215 and the exposure of cavities 1005, pattern layer 210 in layout piece 110 includes a collection of pattern features 1205. Pattern features 1205 can be used in a functional design layout of a microelectronic device. Pattern features 1205 can have pitch 320 that is limited by the pitch available from the lithographic technique used to form contacts 305. Moreover, depending upon the geometry of resist Figure 805, pattern features 1205 can also have an arbitrary arrangement in pattern layer 210 since, after irregularity is introduced into repeating array 300, the impact of at least some of the small pitch features 305 upon wafer 100 has been eliminated.

Such composite patterning can prove advantageous. For example, a single layout piece can be patterned with features using a higher resolution system or technique and the functional impact of those features can be modified or even eliminated using a lower resolution system or technique. For example, older, typically lower resolution, equipment can be used to modify the impact of higher resolution features, providing increased lifespans to the older equipment. Patterning cost can be decreased by devoting high resolution systems to the production of high resolution features while using less expensive, lower resolution systems for the modification of the impact of those high resolution features. For example, high resolution but relatively inexpensive interferometric systems can be combined with relatively inexpensive low resolution systems to produce high quality, high resolution patterns without large capital investments. Since the arrangement of patterns produced using interferometric systems can be changed using lower resolution systems, the applicability of interferometric systems can be increased. In particular, interferometric systems can be used to form substantially arbitrary arrangements of features that are not constrained by the geometries and arrangements of interference patterns.

Figure 14:
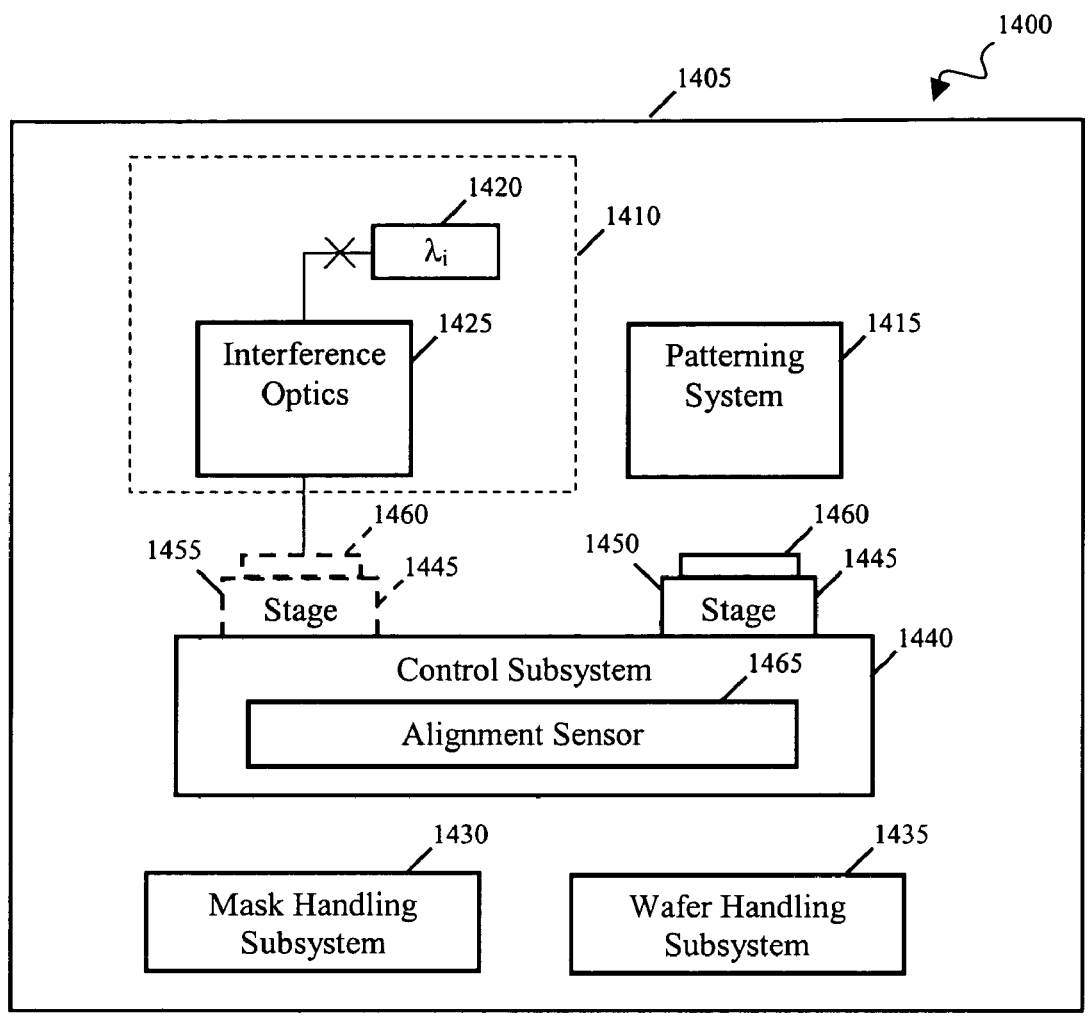
FIG. 14 shows a composite optical lithography system.

FIG. 14 shows a composite optical lithography system 1400. System 1400 includes an environmental enclosure 1405. Enclosure 1405 can be a clean room or other location suitable for printing features on substrates. Enclosure 1405 can also be a dedicated environmental system to be placed inside a clean room to provide both environmental stability and protection against airborne particles and other causes of printing defects.

Enclosure 1405 encloses an interference lithography system 1410 and a patterning system 1415. Interference lithography system 1410 includes a collimated electromagnetic radiation source 1420 and interference optics 1425 that together provide interferometric patterning of substrates. Patterning system 1415 can use any of a number of different approaches for patterning a substrate. For example, patterning system 1415 can be an e-beam projection system, an imprint printing system, or an optical projection lithography system. Patterning system 1415 can also be a maskless module, such as an electron beam direct write module, an ion beam direct write module, or an optical direct write module.

Systems 1410, 1415 can share a common mask handling subsystem 1430, a common wafer handling subsystem 1435, a common control subsystem 1440, and a common stage 1445. Mask handling subsystem 1430 is a device for positioning a mask in system 1400. Wafer handling subsystem 1435 is a device for positioning a wafer in system 1400. Control subsystem 1440 is a device for regulating one or more properties or devices of system 1400 over time. For example, control subsystem 1440 can regulate the position or operation of a device in system 1400 or the temperature or other environmental qualities within environmental enclosure 1405.

Control subsystem 1440 can also translate stage 1445 between a first position 1450 and a second position 1455. Stage 1445 includes a chuck 1460 for gripping a wafer. At first position 1450, stage 1445 and chuck 1460 can present a gripped wafer to patterning system 1415 for patterning. At second position 1455, stage 1445 and chuck 1460 can present a gripped wafer to interference lithography system 1410 for interferometric patterning.

To ensure the proper positioning of a wafer by chuck 1460 and stage 1445, control subsystem 1440 includes an alignment sensor 1465. Alignment sensor 1465 can transduce and control the position of the wafer (e.g., using wafer alignment marks) to align a pattern formed using interference lithography system 1410 with a pattern formed by patterning system 1415. Such positioning can be used when introducing irregularity into a repeating array of features, as discussed above.

Figure 15:
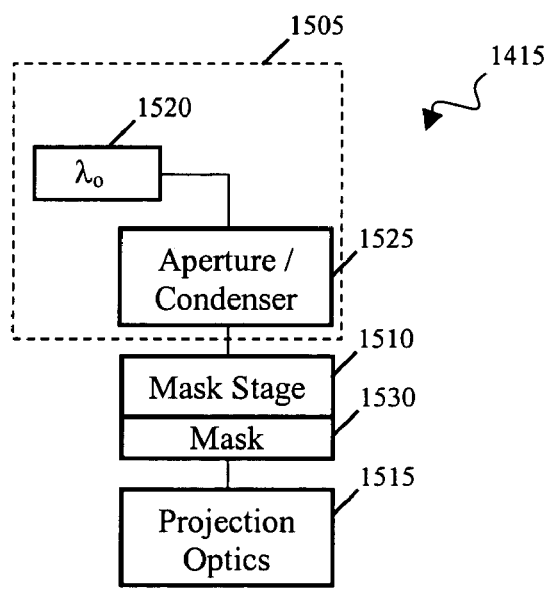
FIG. 15 shows an example patterning system in the composite optical lithography system of FIG. 14.

FIG. 15 shows an example optical lithographic implementation of patterning system 1415. In particular, patterning system 1415 can be a step-and-repeat projection system. Such a patterning system 1415 can include an illuminator 1505, a mask stage 1510, and projection optics 1515. Illuminator 1505 can include an electromagnetic radiation source 1520 and an aperture/condenser 1525. Source 1520 can be the same as source 1420 or source 1520 can be an entirely different device. Source 1520 can emit at the same or at a different wavelength as source 1420. Aperture/condenser 1525 can include one or more devices for collecting, collimating, filtering, and focusing the electromagnetic emission from source 1420 to increase the uniformity of illumination upon mask stage 1510.

Mask stage 1510 can support a mask 1530 in the illumination path. Projection optics 1515 can be a device for reducing image size. Projection optics 1515 can include a filtering projection lens. As stage 1445 repeatedly translates a gripped wafer for exposure by illuminator 1505 through mask stage 1510 and projection optics 1515, alignment sensor 1465 can ensure that the exposures are aligned with a repeating array of interferometric features to introduce irregularity into the repeating array.

A number of implementations have been described. Nevertheless, it will be understood that various modifications may be made. For example, both positive and negative resists can be used for either of resist layers 220, 705. Lithographic techniques that use different wavelengths can be used to process the same substrate. Substrates other than semiconductor wafers can be patterned. Accordingly, other implementations are within the scope of the following claims.

What is claimed is:

1. A device, comprising:
    a substantially arbitrary arrangement of contacts, the contacts having a definition characteristic of interference lithography, wherein the contacts have been defined in a substrate by a method that includes
    exposing a first resist using interference lithography;
    etching a sacrificial layer using the exposed first resist as a guide;
    covering the sacrificial layer with a second resist;
    exposing and developing the second resist so that a first portion of the sacrificial layer is uncovered and a second portion of the sacrificial layer remains covered; and
    etching the substantially arbitrary arrangement of contacts in the substrate using the first portion of the sacrificial layer as a guide.

2. The device of claim 1, wherein the substantially arbitrary arrangement of contacts comprises contacts printed with a pitch approaching one half the wavelength of a patterning electromagnetic radiation.

3. The device of claim 1, wherein the substantially arbitrary arrangement of contacts comprises contacts free from defects arising due to one or more of lens imperfections and mask imperfections.

4. The device of claim 1, wherein the substantially arbitrary arrangement of contacts comprises contacts free from defects arising due to backscatter of electrons.

5. The device of claim 1, wherein the substantially arbitrary arrangement of contacts comprises a portion of a microelectronic device.

6. The device of claim 5, wherein the portion of the microelectronic device comprises a portion of an SRAM memory device.

7. The device of claim 1, wherein the first resist has been exposed by exposing the first resist to two substantially orthogonal interference patterns.

8. The device of claim 7, wherein the first resist has been exposed by exposing the first resist to two substantially orthogonal interference patterns formed using laser beams.

9. The device of claim 7, wherein the contacts have a same pitch in the directions of the substantially orthogonal interference patterns.

10. The device of claim 1, wherein the first resist has been exposed by a method that includes
    exposing the first resist to an interference pattern of electromagnetic radiation,
    rotating the first resist relative to the interference pattern, and
    exposing the rotated first resist to the interference pattern.

11. The device of claim 1, wherein covering the sacrificial layer with the second resist comprises capping the sacrificial layer with the second resist.

12. The device of claim 1, wherein covering the sacrificial layer with the second resist comprises filling the etched sacrificial layer with the second resist.

13. The device of claim 1, wherein covering the sacrificial layer with the second resist comprises spin coating the second resist on top of the sacrificial layer.

14. The device of claim 1, wherein exposing the second resist comprises exposing the second resist with a pitch that is two or more times as large as the interference lithography pitch.

15. The device of claim 1, wherein exposing the second resist comprises exposing the second resist using a binary optical lithography system.

16. A method comprising:
exposing a first resist using interference lithography;
etching a sacrificial layer using the exposed first resist as a guide;
covering the sacrificial layer with a second resist;
exposing and developing the second resist so that a first portion of the sacrificial layer is uncovered and a second portion of the sacrificial layer remains covered; and
etching a substantially arbitrary arrangement of contacts in a substrate using the first portion of the sacrificial layer as a guide,
wherein the contacts have a definition characteristic of interference lithography.

17. The method of claim 16, wherein exposing the first resist comprises exposing the first resist to two substantially orthogonal interference patterns.

18. The method of claim 17, wherein exposing the first resist comprises forming the two substantially orthogonal interference patterns using laser beams.

19. The method of claim 17, wherein exposing the first resist comprises exposing first resist with the same pitch in the directions of the substantially orthogonal interference patterns.

20. The method of claim 16, wherein exposing the first resist comprises:
exposing the first resist to an interference pattern of electromagnetic radiation;
rotating the first resist relative to the interference pattern; and
exposing the rotated first resist to the interference pattern.

21. The method of claim 16, wherein covering the sacrificial layer with the second resist comprises capping the sacrificial layer with the second resist.

22. The method of claim 16, wherein covering the sacrificial layer with the second resist comprises filling the etched sacrificial layer with the second resist.

23. The method of claim 16, wherein covering the sacrificial layer with the second resist comprises spin coating the second resist on top of the sacrificial layer.

24. The method of claim 16, wherein exposing the second resist comprises exposing the second resist with a pitch that is two or more times as large as the interference lithography pitch.

25. The method of claim 16, wherein exposing the second resist comprises exposing the second resist using a binary optical lithography system.

* * * * *